(12) United States Patent
Dyson et al.

(10) Patent No.: US 11,183,626 B1
(45) Date of Patent: Nov. 23, 2021

(54) MAGNETOSTRICTIVE ALTERNATOR

(71) Applicant: United States of Americas as represented by the Administrator of NASA, Washington, DC (US)

(72) Inventors: Rodger W. Dyson, Elyria, OH (US); Geoffrey A. Bruder, Parma Heights, OH (US)

(73) Assignee: United States of America as Represented by the Administrator of National Aeronautics and Space Administration, Washington, DC (US)

(*) Notice: Subject to any disclaimer, the term of this patent is extended or adjusted under 35 U.S.C. 154(b) by 816 days.

(21) Appl. No.: 15/840,704

(22) Filed: Dec. 13, 2017

Related U.S. Application Data

(63) Continuation of application No. 13/916,797, filed on Jun. 13, 2013, now Pat. No. 9,871,186.

(60) Provisional application No. 61/677,116, filed on Jul. 30, 2012.

(51) Int. Cl.
*H01L 41/12* (2006.01)
*H01L 41/113* (2006.01)

(52) U.S. Cl.
CPC .......... *H01L 41/125* (2013.01); *H01L 41/113* (2013.01)

(58) Field of Classification Search
CPC ............... H01L 41/113; H01L 41/1134; H01L 41/1136; H01L 41/1138

USPC ........................................................ 310/339
See application file for complete search history.

(56) References Cited

U.S. PATENT DOCUMENTS

| | | | | |
|---|---|---|---|---|
| 6,150,752 A | * | 11/2000 | Bishop | B01J 19/10 310/328 |
| 2001/0035723 A1 | * | 11/2001 | Pelrine | H02N 2/18 318/116 |
| 2010/0244457 A1 | * | 9/2010 | Bhat | F16F 15/005 290/1 A |
| 2013/0320804 A1 | * | 12/2013 | Symko | H01L 41/113 310/306 |

* cited by examiner

*Primary Examiner* — Derek J Rosenau
(74) *Attorney, Agent, or Firm* — Robert H. Earp, III; Mark Wolfgang; Helen M. Galus

(57) ABSTRACT

A magnetostrictive alternator configured to convert pressure waves into electrical energy is provided. It should be appreciated that the magnetostrictive alternator may be combined in some embodiments with a Stirling engine to produce electrical power. The Stirling engine creates the oscillating pressure wave and the magnetostrictive alternator converts the pressure wave into electricity. In some embodiments, the magnetostrictive alternator may include aerogel material and magnetostrictive material. The aerogel material may be configured to convert a higher amplitude pressure wave into a lower amplitude pressure wave. The magnetostrictive material may be configured to generate an oscillating magnetic field when the magnetostrictive material is compressed by the lower amplitude pressure wave.

4 Claims, 2 Drawing Sheets

MAGNETOSTRICTIVE ALTERNATOR

CROSS REFERENCE TO RELATED APPLICATIONS

This application is a Continuation Application claiming the benefit of priority from U.S. patent application Ser. No. 13/916,797 filed on Jun. 13, 2013, pending, which claims priority to U.S. Patent Application Ser. No. 61/677,116, entitled "Magnetostrictive Alternator—Low Cost, No Moving Part, High Efficiency, Oscillating Acoustic Pressure Wave to Electric Power Transducer", filed Jul. 30, 2012, the subject matter of which is hereby incorporated by reference in its entirety.

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD

The present invention relates to alternators and, more particularly, to a magnetostrictive alternator configured to convert pressure waves into electrical energy.

BACKGROUND

Stirling engines use alternators, such as moving linear magnet alternators, to convert mechanical motion into electrical energy. For instance, conventional alternators use a piston that moves a magnet and/or coil, and the change in magnetic field induces a current in the coil to deliver electric power to the load. However, with the use of moving pistons, the frequency, efficiency, and maximum power output of the energy produced by such alternators is limited.

Accordingly, an improved alternator may be beneficial.

SUMMARY

Certain embodiments of the present invention may provide solutions to the problems and needs in the art that have not yet been fully identified, appreciated, or solved by current alternators. For instance, some embodiments of the present invention replace an oscillating linear alternator with an impedance and resonance matched magnetostrictive based transducer.

In one embodiment, an apparatus is provided. The apparatus includes aerogel material and magnetostrictive material. The aerogel material is configured to convert a higher amplitude pressure wave into a lower amplitude pressure wave. The magnetostrictive material is configured to generate an oscillating magnetic field when the magnetostrictive material is compressed by the lower amplitude pressure wave.

In another embodiment, an apparatus is provided. The apparatus includes an absorbing material and a compressing material. The absorbing material is configured to convert a higher amplitude pressure wave into a lower amplitude pressure wave. The compressing material is configured to generate an oscillating magnetic field when the compressing material is compressed by the lower amplitude pressure wave.

In yet another embodiment, an apparatus is provided. The apparatus includes an absorbing material and a piezoelectric material. The absorbing material is configured to convert a higher amplitude pressure wave into a lower amplitude pressure wave. The piezoelectric material is configured to generate an oscillating electric field when the lower amplitude pressure wave is applied to the piezoelectric material.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to a Stirling magnetostrictive alternator having stacked magnetostrictive material under a biased magnetic and stress induced compression with continuous gradient impedance matching material. Alternating compression and expansion of the magnetostrictive material may be configured to create an alternating magnetic field to induce an electric current in a coil that is wrapped around the magnetostrictive material. This allows production of electrical power from the acoustic pressure wave.

Figure 1A:
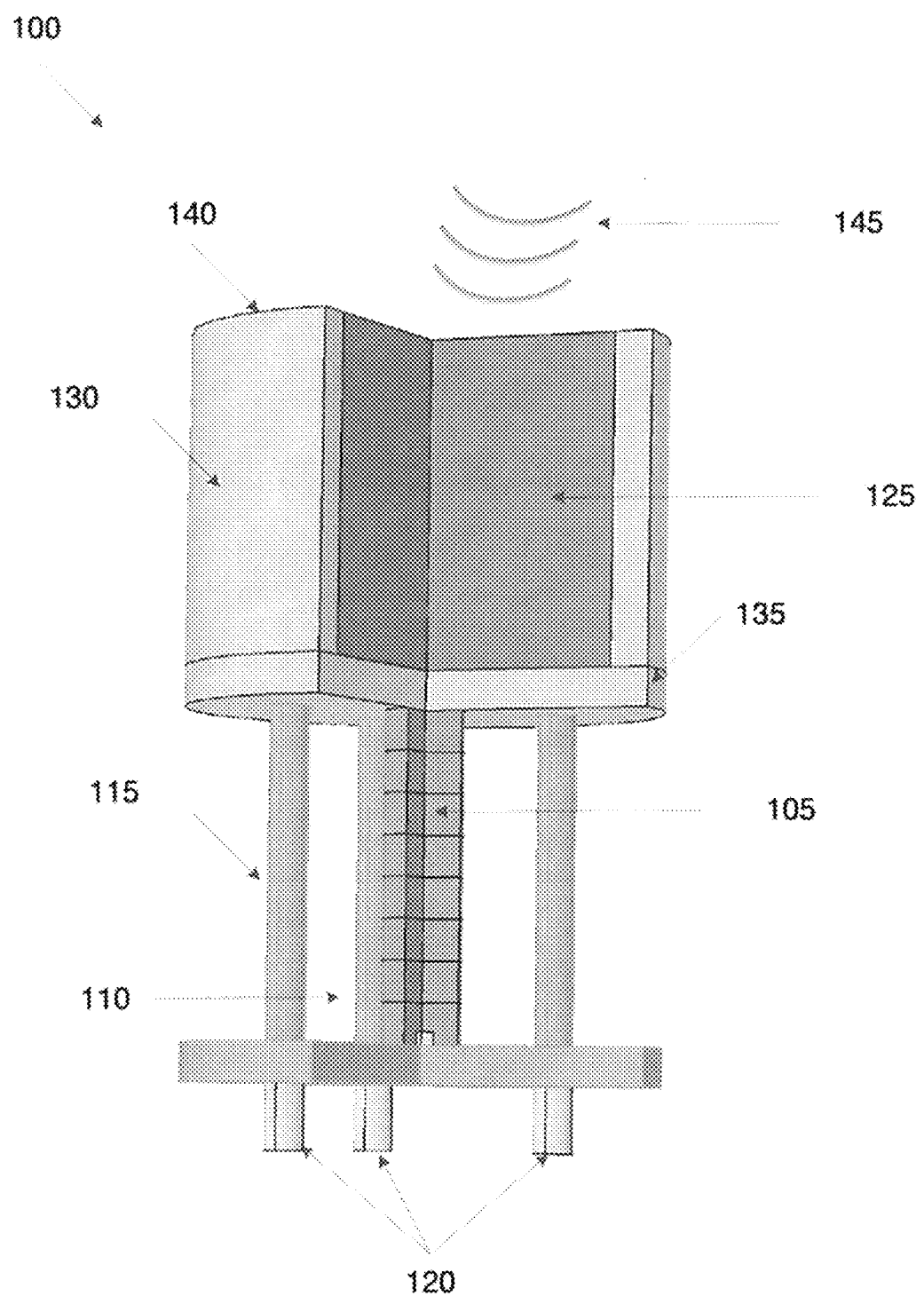
FIG. 1A illustrates a magnetostrictive alternator, according to an embodiment of the present invention.

FIG. 1A illustrates a magnetostrictive alternator 100, according to an embodiment of the present invention. Magnetostrictive alternator (hereinafter "alternator") 100 may be operated as an electrical power source that is connected to, and provides power to, a Stirling engine. As shown in FIG. 1A, alternator 100 includes a stack of magnetostrictive material 105, such as Terfenol-D™, Nickel, Nitinol or Galfenol, or any material that would be appreciated by a person of ordinary skill in the art. In other embodiments, piezoelectric material, or any type of material that can be compressed by a pressure force, may be used depending on the configuration of alternator 100. In certain embodiments, the stack of magnetostrictive material 105 is wrapped in coils. The coils may be composed of copper, aluminum, or any electrically conductive material that can be enveloped by an insulating material and wound into a coil. It should be appreciated that if piezoelectric material is used, then a coil may not be wrapped around the piezoelectric material.

It should be appreciated that in some embodiments, a pre-stress (or compression) is applied to magnetostrictive material 105. This allows for an increase in power output. To achieve an increase in power output, pre-stress permanent magnets 110 and pre-stress bolts 115 are used to compress, or increase stress on, the stack of magnetostrictive material 105 to an ideal location in terms of the linear range of magnetostrictive material 105 for producing an increase in electrical power output.

Pre-stress permanent magnets 110 in this embodiment are configured to provide a magnetic field causing magnetostrictive material 105 to remain in a compressed state. In some embodiments, secondary pre-stress coils may be used for this purpose, but this may require a separate power source to produce the magnetic field. The pre-stress effect maximizes the efficiency of magnetostrictive material 105. It should be noted that without pre-stress permanent magnets 110, the power output may be reduced.

Stated differently, magnetostrictive material 105 is compressed to allow magnetostrictive material 105 to include some force. In other words, a predefined amount of pre-stress is applied to magnetostrictive material 105. Thus, when a fairly high amplitude pressure wave 145, which is produced by a Stirling engine (or another acoustic source), reaches alternator 100, pressure wave 145 causes further compression of magnetostrictive material 105 to generate an increase in electrical power output. In certain embodiments, pressure wave 105 may be an oscillating pressure wave. Because pressure wave 105 may move helium or other atoms approximately 5 mm in either direction and to prevent pressure wave 105 from reflecting off of magnetostrictive material 105, a varying density aerogel 125 is utilized for impedance matching with magnetostrictive material 105. It should be noted that any type of absorbing material, which can impedance match, may be used. This allows energy from pressure wave 145 to be absorbed into magnetostrictive material 105, creating a greater output of electrical power. It should be appreciated that other impedance matching materials, such as steel rods, may be used instead of aerogel. However, this depends on the Stirling engine operating parameters.

Certain embodiments may include a protective diaphragm 140 to help keep aerogel 125 from breaking up. An impedance layer support 130 surrounds aerogel 125 to hold aerogel 125 in place.

As mentioned above, aerogel 125 may be configured to absorb pressure wave 145 to avoid reflection, and change a high amplitude of pressure wave 145 to a lower (or smaller) amplitude pressure wave (not shown) without losing the energy in the pressure wave, allowing the energy to compress magnetostrictive material 105 efficiently. In order to translate the force from aerogel 125 to magnetostrictive material 105, a force plate 135 is utilized.

Once the mechanical energy in aerogel 125 reaches magnetostrictive material 105, magnetostrictive material 105 is compressed via force plate 135 at a certain frequency (e.g., approximately 100 times per second), producing an oscillating magnetic field. The magnetic field causes the state of the coil, which is wrapped around magnetostrictive material 105, to move to a varying magnetic flux environment. Because the coil is in a varying magnetic flux environment, an electrical field (e.g., a current) is induced in the coil to produce electrical power.

Located near magnetostrictive material 105 are Bellville washers 120. Bellville washers 120 are configured to prevent alternator 100 from being over-constrained, allowing force plate 135 to move.

It should be appreciated that alternator 100 does not require a piston to be moving in order to produce electrical power as the parts in alternator 100 are compressing. Further, if a moving-part Stirling engine is replaced with a non-moving-part Stirling engine, then a generator having no moving parts can be achieved. It should also be appreciated that alternator 100 may be scalable, such that multiple alternators can be stacked upon each other. Alternator 100 may also vary in size depending on the frequency desired.

Figure 1B:
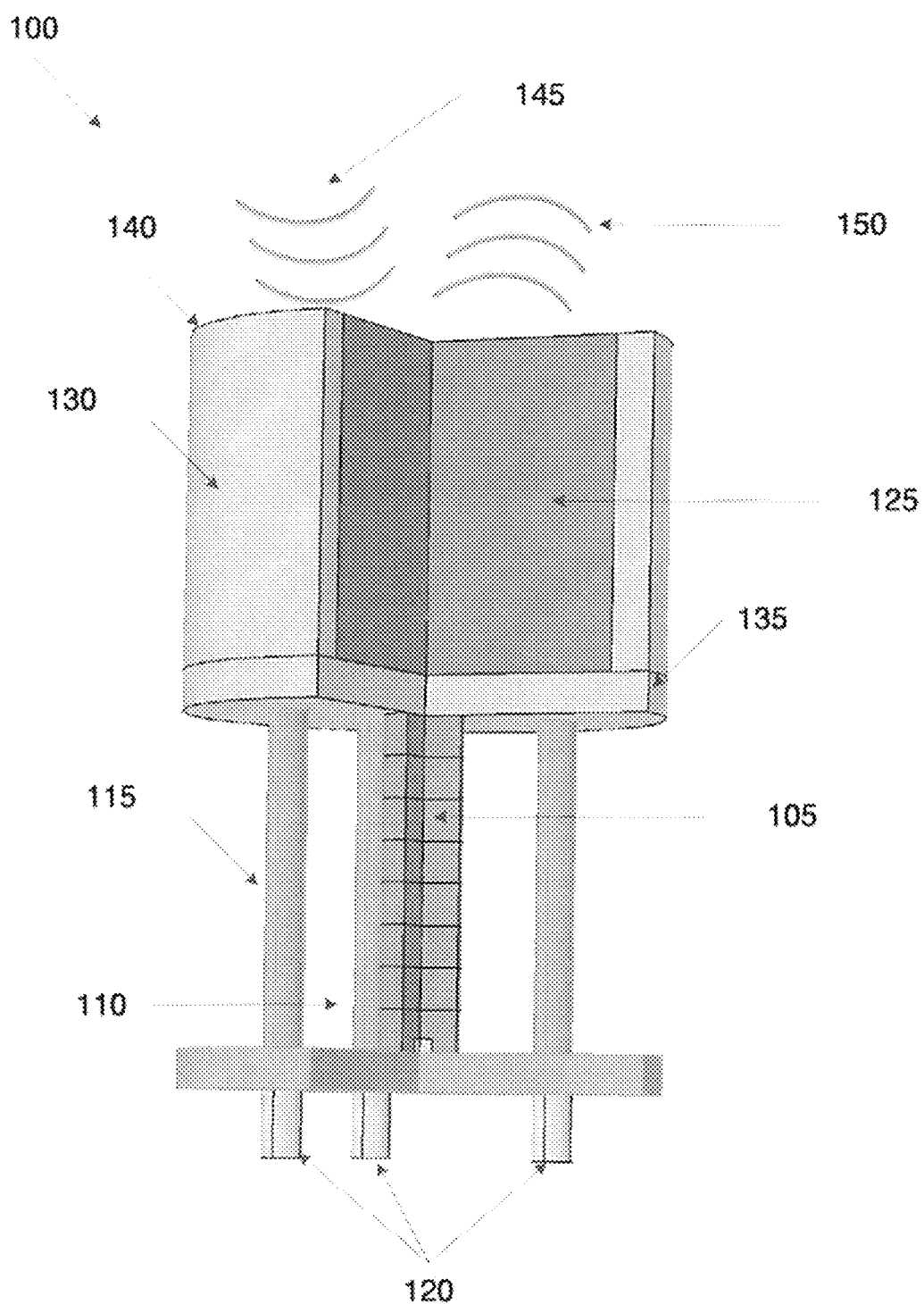
FIG. 1B illustrates a magnetostrictive resonator, according to an embodiment of the present invention.

As shown in FIG. 1B, alternator 100 may also be used as a resonator. In such an embodiment, a large amplitude wave 145 that is received by aerogel 125 or steel rod (not shown), and is reduced to a lower amplitude wave (not shown). The lower amplitude wave has a high force that collides with force plate 135, causing magnetostrictive material 105 to compress. The compression of magnetostrictive material 105 allows electricity to be generated.

However, because not all of the compression is converted to electricity, the unconverted amount of compression is configured to bounce. This may cause magnetostrictive material 105 to re-expand, creating a low amplitude wave (not shown). The low amplitude wave is configured to travel to aerogel 135 and is converted to a high amplitude wave 150. High amplitude wave 150 is then transmitted to the Stirling engine to provide resonance.

Some embodiments of the present invention pertain to an oscillating pressure wave that is converted into a low amplitude pressure wave to compress the magnetostrictive material in order to generate electrical power. As a result, bearings, lubrication, etc., are not required, lowering operational cost. The alternator described herein may also be used for generating power in vehicles (air, sea, land, or space), as well as buildings. It should be appreciated that the alternator described herein may produce electrical power, create a resonance for the Stirling engine, provide control of the Stirling engine, and create un-amplified pressure wave in the Stirling engine that can be amplified at a later time.

It will be readily understood that the components of the invention, as generally described and illustrated in the figures herein, may be arranged and designed in a wide variety of different configurations. Thus, the detailed description of the embodiments is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with an embodiment may be included in at least one embodiment of the invention. Thus, appearances of the phrases "in certain embodiments," "in some embodiments," "in other embodiments," or other similar language, throughout this specification do not necessarily all refer to the same embodiment or group of embodiments, and the described features, structures, or characteristics may be combined in any suitable manner in one or more embodiments.

One having ordinary skill in the art will readily understand that the invention as discussed above may be practiced with steps in a different order, and/or with hardware elements in configurations that are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:
1. An apparatus, comprising:
a wave absorbing impedance matching material configured to continuously transition from a lower impedance to a higher impedance in one direction and from the higher impedance to the lower impedance in the oppo- site direction, and configured to permit the transmission of an acoustic wave therethrough;

a piezoelectric material coupled to the wave absorbing impedance matching material to generate an oscillating electric field when the acoustic wave compresses the piezoelectric material;

a force plate having two sides, said first side facing the absorbing material and said second side facing the piezoelectric material, configured to translate force generated by an acoustic wave into the piezoelectric material; and Bellville washers, located in line with the force plate and piezoelectric material so that the piezoelectric material is between the force plate and the Bellville washers, configured to prevent the apparatus from being over-constrained by allowing the force plate and piezoelectric material to move.

2. The apparatus of claim 1, wherein the absorbing material comprises aerogel.

3. The apparatus of claim 1, wherein the absorbing material is configured to absorb an acoustic wave from a Stirling engine to prevent reflection.

4. The apparatus of claim 1, further comprising:

a protective diaphragm configured to prevent the absorbing material from breaking; and an impedance layer support surrounding the absorbing material, configured to maintain a position of the absorbing material.

\* \* \* \* \*